United States Patent
Oh et al.

(10) Patent No.: US 7,947,567 B2
(45) Date of Patent: May 24, 2011

(54) METHOD OF FABRICATING A SEMICONDUCTOR DEVICE WITH REDUCED OXIDE FILM VARIATION

(75) Inventors: Junji Oh, Kawasaki (JP); Masanori Terahara, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/845,543

(22) Filed: Aug. 27, 2007

(65) Prior Publication Data

US 2008/0081384 A1    Apr. 3, 2008

(30) Foreign Application Priority Data

Sep. 29, 2006   (JP) ................................ 2006-269634

(51) Int. Cl.
    *H01L 21/762*     (2006.01)

(52) U.S. Cl. .................. 438/424; 257/E21.54

(58) Field of Classification Search .................. 438/218, 438/221, 294, 296, 424, 758, 778; 257/506, 257/E21.537, E21.54, E21.545, E21.546

See application file for complete search history.

(56) References Cited

U.S. PATENT DOCUMENTS

| 6,472,324 | B2 * | 10/2002 | Kusakabe et al. | 438/692 |
| 2002/0056700 | A1 * | 5/2002 | Ohmori | 216/84 |
| 2003/0003644 | A1 * | 1/2003 | Uenishi et al. | 438/200 |
| 2006/0258076 | A1 * | 11/2006 | Mizushima et al. | 438/201 |

FOREIGN PATENT DOCUMENTS

| JP | 11340315 A | | 12/1999 |
| JP | 2002151465 A | | 5/2002 |
| JP | 2003313091 A | * | 11/2003 |

* cited by examiner

*Primary Examiner* — Matthew S Smith
*Assistant Examiner* — Michele Fan
(74) *Attorney, Agent, or Firm* — Fujitsu Patent Center

(57) ABSTRACT

A semiconductor device fabrication method is disclosed. The method comprises an insulating film forming step of forming an insulating film on a semiconductor substrate; a trench forming step of forming a trench for device isolation in a predetermined part of the semiconductor substrate; a trench filling step of forming a buried oxide film filling the trench; a polishing step of polishing the buried oxide film on the semiconductor substrate until the insulating film is exposed; a thickness measuring step of measuring the thickness of the insulating film remaining after the polishing; an etching amount determining step of determining an etching amount of etching the polished buried oxide film based on the measured thickness of the remaining insulating film; and a buried oxide film etching step of etching the polished buried oxide film based on the determined etching amount.

11 Claims, 8 Drawing Sheets

15 Buried oxide
12 thermally oxidized film
11

15

15
18 silicon dioxide sacrificial film 15  18
n-well  p-well  p-well
19n  19p  19p n-well  p-well  p-well
19n  19p  19p 23 gate polysilicon
21 gate oxide
15 Buried oxide

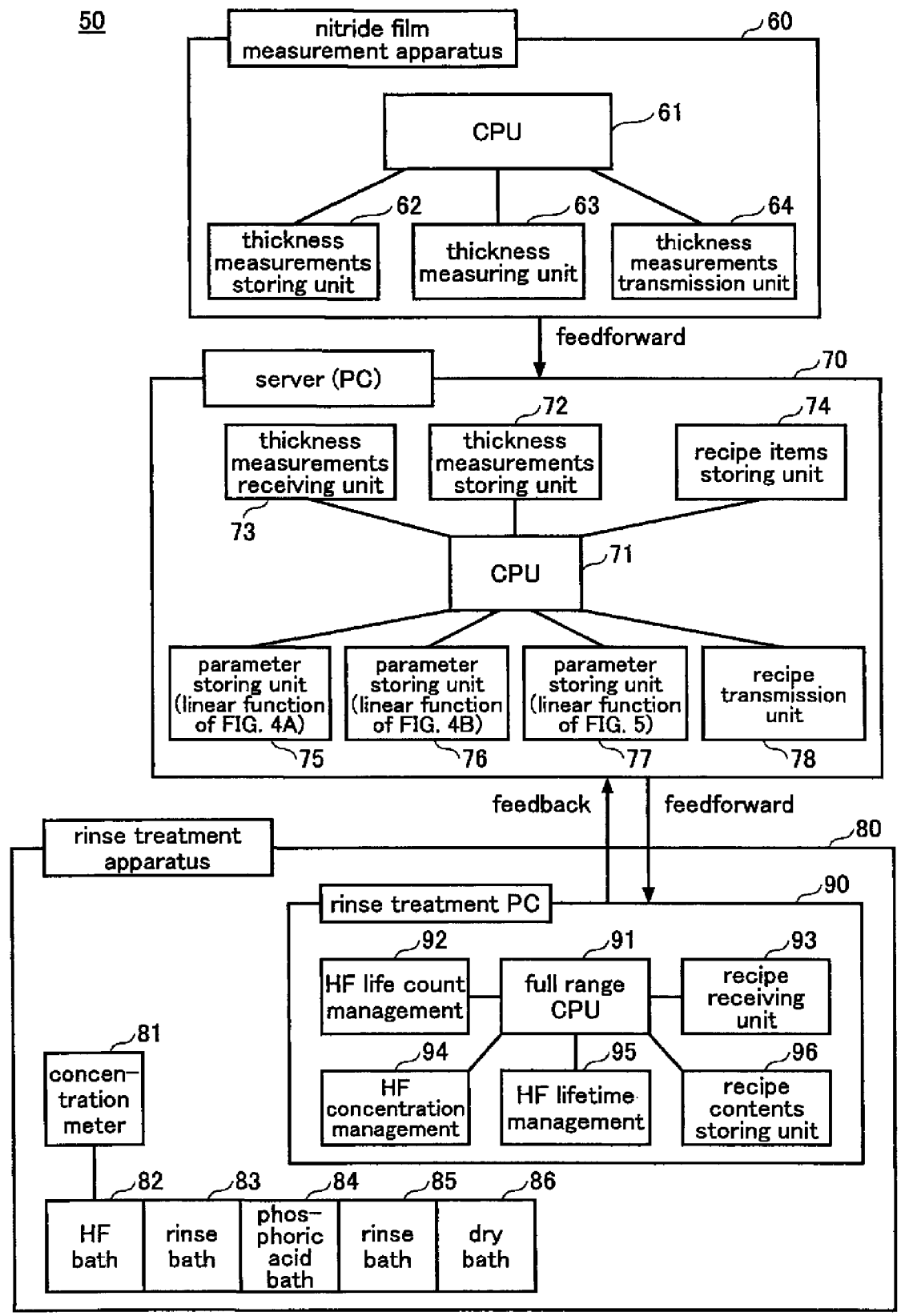

METHOD OF FABRICATING A SEMICONDUCTOR DEVICE WITH REDUCED OXIDE FILM VARIATION

CROSS-REFERENCE TO RELATED APPLICATIONS

The present application is based on Japanese Priority Application No. 2006-269634 filed on Sep. 29, 2006, with the Japanese Patent Office, the entire contents of which are hereby incorporated by reference.

BACKGROUND OF THE INVENTION

1. Field of the Invention

The present invention is generally related to a semiconductor device fabrication technique, and more particularly, to a method for reducing the difference in level between an STI isolation (which may be simply referred to as an "STI" region) and an active device region (which may be simply referred to as an 'ACTIVE' region) in a wafer and a system for implementing the method in an efficient manner.

2. Description of the Related Art

Various techniques for achieving flat and even surfaces of STI regions in a semiconductor wafer have been proposed and employed in semiconductor device fabrication technologies because uneven surfaces of STI regions make gate electrode (and/or gate line) patterning difficult. For example, JP 11-340315A discloses a technique for forming a shallow trench isolation (STI) region having a flat surface by preventing undesirable depressions from being produced along the edges of the STI region. According to this method, an oxide film is formed on a silicon (Si) substrate by thermal oxidation, and a silicon nitride stopper film is formed over the oxide film. Then, specific areas of the stopper film, the oxide film, and the Si substrate are successively removed by selective etching using a photolithography technique, thereby forming an STI trench. A thermally oxidized film is formed on the inner surface of the STI trench, and then oxide is deposited on the entire surface, thereby forming a buried oxide film filling the STI trench. The buried oxide film is polished by chemical mechanical polishing (CMP) until the SiN stopper film is exposed, and then the SiN stopper film is removed by a phosphoric acid etchant. A portion of the buried oxide film remains projecting from the STI trench. The side walls of the projecting portion of the buried oxide film are then covered with a side-wall oxide film, and the projecting portion of the buried oxide film is removed together with the side-wall oxide film by isotropic etching so as to flatten the STI region. Thus, it is possible to prevent depressions from being produced along the edges of the STI region in the flattening process.

Meanwhile, JP 2002-151465A discloses a technique for reflecting the wafer conditions in the wafer processing parameters by a feed-forward system to guarantee stable qualities of semiconductor devices. With this technique, the thickness of the buried oxide film is measured and fed forward to the subsequent process to determine the etching condition or other processing conditions.

The STI region forming method of the former publication (JP 11-340315A) can prevent local depressions at the edges of the STI region from being produced, but cannot prevent an indentation across the entire surface of the STI region from being formed unless such wafer conditions are fed forward to reflect the presence of the indentation in determining the etching amount of the buried oxide film.

Although the feed-forward technique of the latter publication (JP 2002-151465A) measures the thickness of the buried oxide film and feeds the measurement result forward to the subsequent process, this technique does not take into account the fact that the degree of the surface indentation varies depending on the area of the STI region, as illustrated in FIG. 1A and FIG. 1B. In these figures, an oxide film 12 and a SiN stopper film 13 are formed in this order over a silicon (Si) substrate 11. A buried oxide film 15 is formed in an STI trench 16 which is formed by partially removing the SiN stopper film 13, the oxide film 12 and the silicon substrate 11.

When CMP is performed to flatten the buried oxide film 15 in the STI trench 16, the STI region is polished more deeply at the center than the edges due to the polishing-rate difference between the buried oxide film 15 and the SiN stopper film 13. The wider the area of the STI region, the deeper the surface indentation at the center of the STI region is, as illustrated in FIG. 1A. That is, a depth d1 of the indentation of the wide STI region (FIG. 1A) is greater than a depth d2 of the indentation of the narrow STI region (FIG. 1B) (d1>d2). In the illustrated examples, the difference between d1 and d2 is 5 nm or greater.

If a wafer has a surface level difference of 5 nm or greater due to the difference of the area between STI regions, the focal position varies during the exposure process, and the resultant gate width (i.e., the longitudinal size of the gate electrode patterned on the wafer) varies about 6 nm. In general, measurement of the thickness of a buried oxide film is carried out using a wide STI region prepared especially for the measurement purpose taking into account the diameter of the irradiation beam spot. However, the area of an STT region of a part where a transistor is actually formed is very small. If the surface level of the STI region of the actual transistor region is controlled based on the thickness of the buried oxide film measured using the wide STI region area, because the referenced measured value is smaller than the thickness of the actual buried oxide film, the resulting surface level difference between the STI region and the ACTIVE region in the transistor region is large. This results in making gate electrode patterning difficult and reducing production yield of semiconductor devices.

In the future, if the gate electrode width is reduced, reduction of production yield may be inevitable. Moreover, the depths of trenches in a STI region of a wafer largely vary, so that a level difference is produced between the STI region and the ACTIVE region even if the thickness of the buried oxide film is referred to.

The above described semiconductor device fabrication methods do not take into account variations between fabrication lots in the processes preceding CMP. Variations include (1) a variation of the thickness of the SiN stopper film 13 (FIGS. 1A and 1B) due to variations in the condition of a furnace or due to a variation between batches in the process of depositing the SiN stopper film 13 (e.g. 25 pieces×6 lots=150 pieces processed per batch), (2) a variation of the thickness of the SiN stopper film 13, which is dependent on the lifetime of SPM solution used for etching of the SiN stopper film 13 during SPM cleaning after dry etching (the longer the lifetime, the greater the etching amount of the SiN stopper film 13), and (3) a variation of the thickness of the SiN stopper film 13 after CMP.

SUMMARY OF THE INVENTION

According to an aspect of the present invention, a semiconductor device fabrication method has (a) an insulating film forming step of forming an insulating film on a semiconductor substrate, (b) a trench forming step of forming a trench for device isolation in a predetermined part of the semiconductor substrate, (c) a trench filling step of forming a buried oxide film filling the trench, (d) a polishing step of polishing the buried oxide film on the semiconductor substrate until the insulating film is exposed, (e) a thickness measuring step of measuring the thickness of the insulating film remaining after the polishing (f) an etching amount determining step of determining an etching amount of etching the polished buried oxide film based on the measured thickness of the remaining insulating film, and (g) a buried oxide film etching step of etching the polished buried oxide film based on the determined etching amount.

According to another aspect of the present invention, a semiconductor device fabrication system has (a) a thickness measuring unit that measures the thickness of a stopper film, which is formed on a semiconductor substrate to be used as a stopper when polishing a buried oxide film filling a trench for device isolation, remaining after the polishing of the buried oxide film, (b) a treating amount determining unit that determines a treating amount for treating the polished buried oxide film based on the measured thickness of the remaining stopper film, (c) a recipe determining unit that determines a recipe for performing a treatment on the buried oxide film based on the determined treating amount, (d) and a rinse treatment apparatus that performs a treatment on the buried oxide film based on the determined recipe.

BRIEF DESCRIPTION OF THE DRAWINGS

FIG. 7 is a diagram schematically showing the configuration of a semiconductor device fabrication system according to an embodiment of the present invention.

DETAILED DESCRIPTION OF THE PREFERRED EMBODIMENT

The following describes preferred embodiments of the present invention with reference to the accompanying drawings.

Figure 1A:
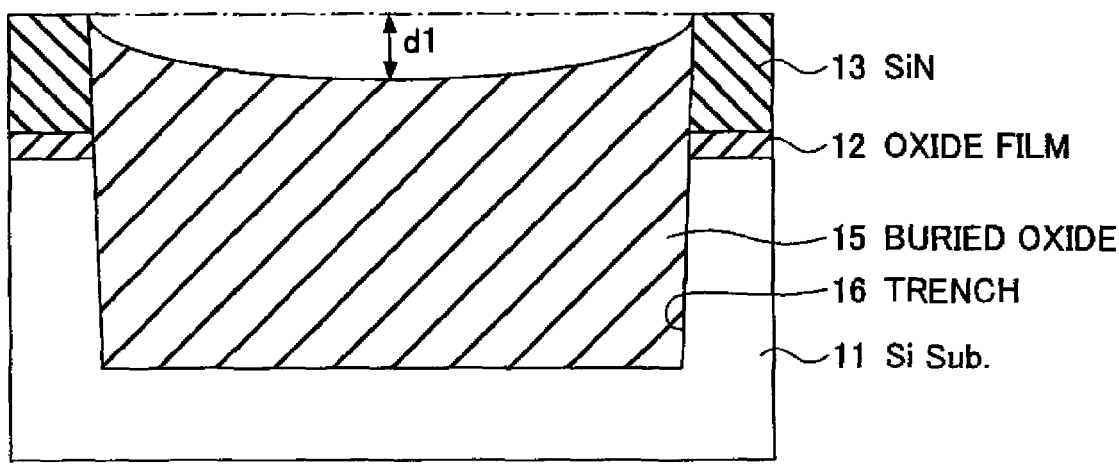
FIGS. 1A and 1B are diagrams for illustrating the differences between indentations in buried oxide films due to the area differences of the area of STI regions.
Figure 1B:
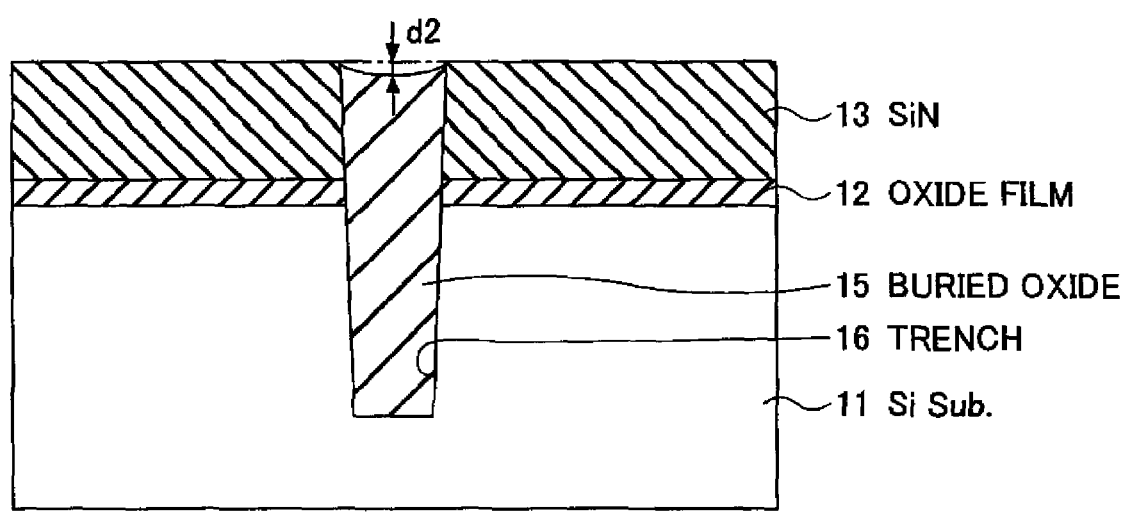
Figure 2:
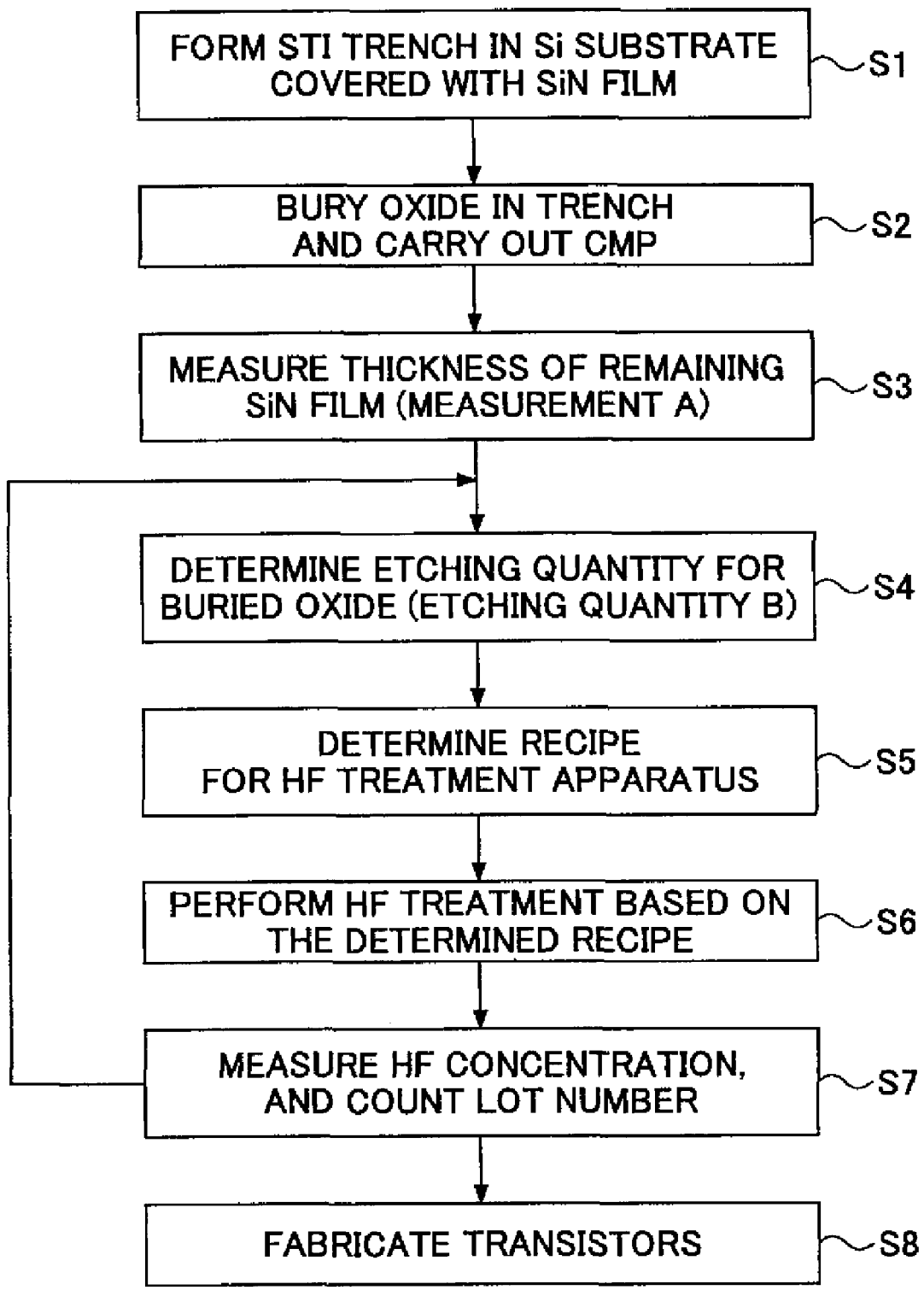
FIG. 2 is a flowchart illustrating a fabrication process of a semiconductor device according to an embodiment of the present invention.

FIG. 2 is a flowchart illustrating a semiconductor device fabrication method according to an embodiment of the present invention. A thermally oxidized film and a SiN film are formed in this order over a Si substrate, and then specific areas of the SiN film, the thermally oxidized film, and the Si substrate are removed by selective etching, thereby forming an STI trench (step S1). The trench is then filled with oxide so as to form a buried oxide film, and then the surface of the buried oxide film is flattened by CMP (step S2).

Then, the thickness of the remaining SiN film is measured (step S3). Based on the measured thickness (hereinafter also referred to as a "measurement A") of the remaining SiN film, a wet etching amount B of the buried oxide film is determined so as not to have a level difference in the surface at the step of forming a gate electrode (step S4). The etching amount B of the buried oxide film is determined based on not only the thickness of the remaining SiN film (the measurement A) but also the hydrofluoric acid concentration in an HF treatment bath, the current lot count, and the like (feedback from S7).

Based on the etching amount B of the buried oxide film, a recipe for the HF treatment bath is determined (step S5). The buried oxide film is etched by the determined etching amount B by using the HF treatment bath based on the determined recipe (step S6).

When the HF treatment of step S6 of this lot is completed, the HF concentration is measured. Also, the lot count is calculated (step S7). The HF concentration and the lot count are taken into account in determining the etching amount B of the buried oxide film in the next lot (feedback to step S4), and the processing proceeds to the next step, where a transistor is formed (step S8). Before the gate electrode is formed, the HF treatment is performed several times for removal of the SiN film, removal of the thermally oxidized film, formation and removal of a sacrificial oxide film for well implantation, surface cleaning before forming a gate insulating film, etc. Because the buried oxide film in the STI trench is etched through theses HF treatments, the amount of etching through these HF treatments to be performed before the gate electrode formation is deduced when determining the etching amount B.

In this way, since the etching amount of the buried oxide film is determined based on the thickness of the SiN film after CMP of the actual ACTIVE region measured and by taking into account the variation of the conditions after each lot, it is possible to form a gate electrode on a flat wafer having substantially no level difference between the STI region and the ACTIVE region.

The following describes each step of FIG. 2 in greater detail with reference to FIG. 3A through FIG. 5. FIGS. 3A through 3D are diagrams for illustrating step S1 through step S3, in which the thickness of the remaining SiN film is measured, of the fabrication process shown in the flowchart of FIG. 2.

Figure 3A:
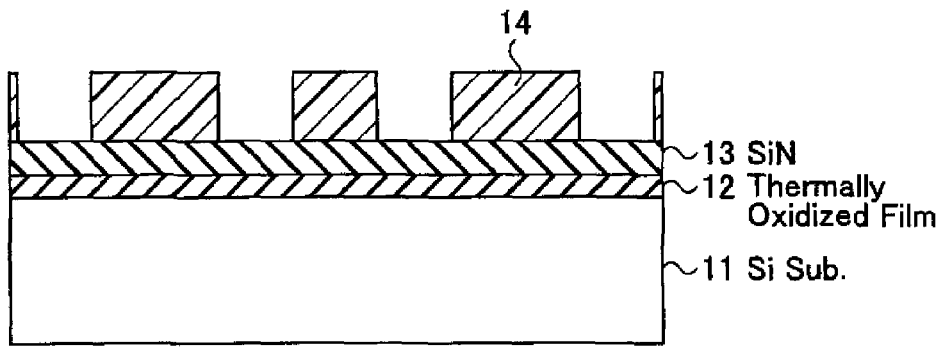
FIGS. 3A through 3D are diagrams illustrating an STI region forming process.

Referring first to FIG. 3A, a thermally oxidized film 12 of 10 nm thickness is formed over a silicon substrate 11. Then, a SiN film 13 of 100 nm thickness is formed over the thermally oxidized film 12 by CVD or the like. The SiN film 13 serves as a stopper film. Resist is applied on the SiN film 13 and patterned by photolithography so as to form a resist pattern 14 with an opening in a STI region.

Figure 3B:
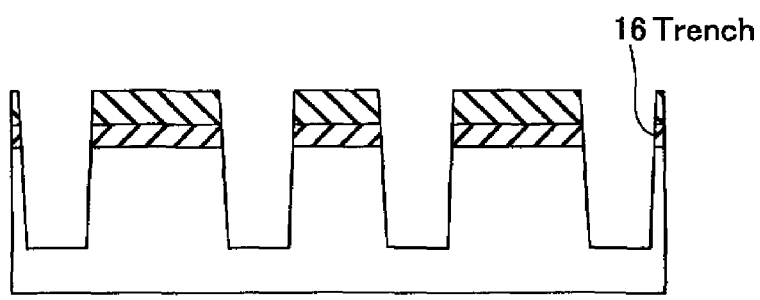

Referring then to FIG. 3B, dry etching is performed using the resist pattern 14 as a mask, so that the SiN film 13 and the thermally oxidized film 12 in the STI region are removed. Then, specific areas of the Si substrate 11 are removed by selective dry etching, so that a trench 16 having a depth in a range of 200 nm through 400 nm is formed in the Si substrate 11. The processes described hereinabove correspond to the processes in step S1 of FIG. 2.

Figure 3C:
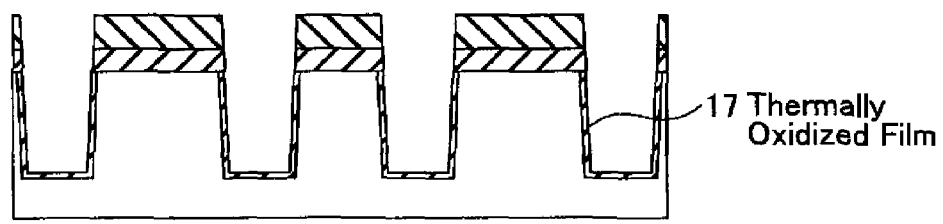

Then, as shown in FIG. 3C, the surface of the trench 16 is thermally oxidized by about 5 nm so as to form a thermally oxidized film 17. This step is not essential and may be omitted.

Figure 3D:
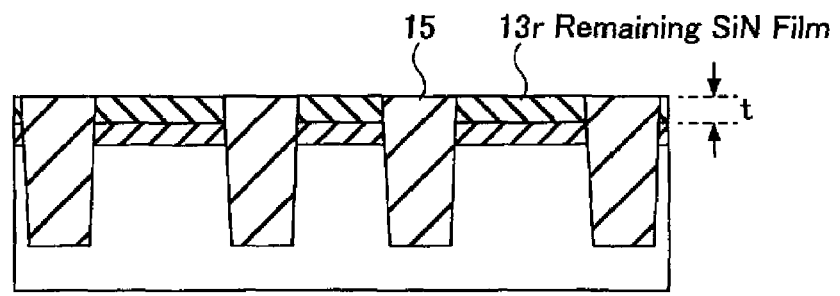

Then, as shown in FIG. 3D, the trench 16 is filled with oxide material, thereby forming a buried oxide film 15. The buried oxide film 15 is polished by CMP until the SiN film 13 is exposed. The buried oxide film 15 is formed using TEOS, for example. Since the surface of the SiN film 13 is also polished by the CMP process, the thickness of the remaining SiN film 13 (referred to as a "SiN film 13r") as a stopper film is reduced compared to the original thickness thereof. Then, the thickness of the SiN film 13r is measured. The measured thickness is used as a measurement A. These processes described hereinabove correspond to the processes in steps S1 and S2 of FIG. 2.

Figure 4A:
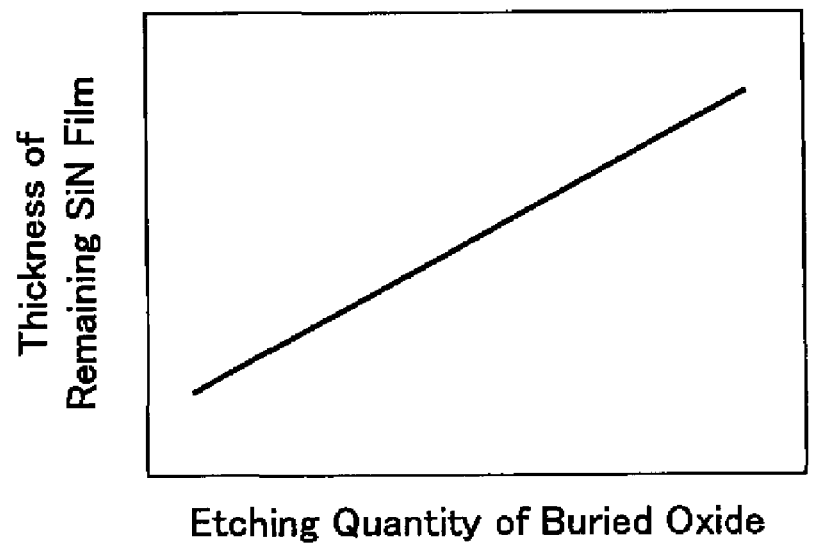
FIGS. 4A and 4B are graphs as examples of parameters used in a process of determining the etching amount of a buried oxide film.
Figure 4B:
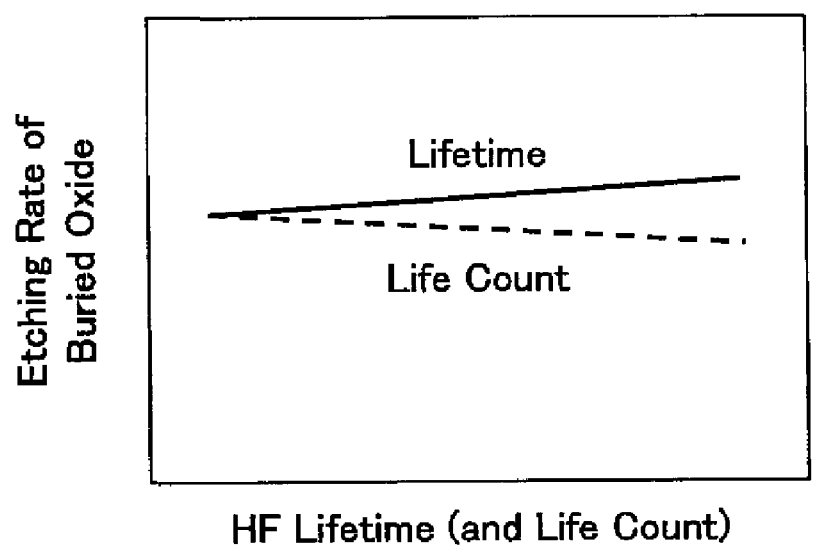

The following describes a process of determining an etching amount B of the buried oxide film 15 (the process in step S4) with reference to FIGS. 4A and 4B.

FIG. 4A is a graph showing a relationship between the etching amount B of the buried oxide film 15 and the thickness of the SiN film 13r. In the illustrated example, the etching amount B of the buried oxide film 15 is expressed as a linear function of the thickness of the SiN film 13r. This linear function may be computed in advance based on the actual measurement and stored in a server or the like so as to output the etching amount B of the buried oxide film 15 when a measurement A of the SiN film 13r after CMP is input during the actual fabrication process.

The recipe for etching the buried oxide film 15 is determined depending on the concentration of HF solution for wet etching of the buried oxide film 15.

FIG. 4B is a graph showing a relationship (continuous line) between the lifetime of the HF solution and the etching rate of the buried oxide film 15 and a relationship (dotted line) between the life count of the HF solution and the etching rate of the buried oxide film 15. The term "lifetime of the HF solution" as used herein indicates the duration of the HF solution circulation. For instance, if the HF solution is replaced one time a day, the lifetime of the HF solution is 24 hours. The longer the lifetime of the HF solution, the greater the concentration of the HF solution. Accordingly, the longer the lifetime of the HF solution used for etching, the higher the etching rate of the buried oxide film 15. Seen in this light, the continuous line shown in FIG. 4B shows the concentration gradient of the HF solution. With use of the linear function indicated by the solid line of FIG. 4B, the recipe for the HF treatment such as, e.g., the treatment time, is corrected based on the elapsed time after the replacement.

The term "life count" as used herein indicates the current lot count in the case where the HF solution is replaced one time every 20 treatment lots, for example. As the lot count (life count) increases, the concentration slightly decreases relative to a predetermined concentration due to introduction of impurities into the HF solution. Along with the concentration reduction, the etching rate also decreases. Thus, the recipe for the HF treatment such as, e.g., treatment time is corrected according to such a variation between lots.

This method allows to more accurately determine the etching amount B of the buried oxide film 15, because the etching amount B is determined based on the measured thickness of the SiN film 13r after CMP in the actual transistor region. Moreover, since the recipe for HF treatment is corrected by taking into account the variation between lots and changes in the HF solution with time, the wafer does not have any surface level difference in the step of forming a gate electrode.

It is to be noted that although the relationship between the lifetime/life count of the HS solution and the etching rate is defined in the example illustrated in FIG. 4B, the relationship between the lifetime/life count of the HF solution and the etching amount may be computed in advance.

Figure 5:
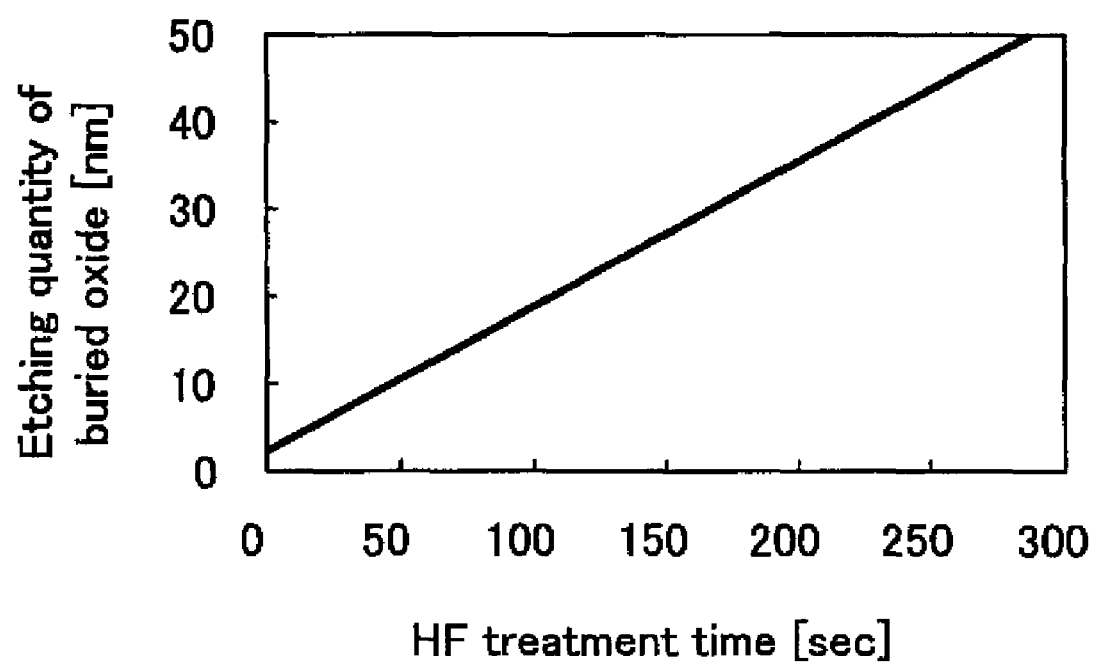
FIG. 5 is a graph as an example of a parameter used in a process of determining a recipe for HF treatment apparatus.

FIG. 5 is a graph used for determination of the recipe for the HF treatment bath (step S5 of FIG. 2) based on the etching amount B determined based on the parameters shown in FIGS. 4A and 4B. In this example, the HF treatment time is used as an example of the recipe. A liner function representing a relationship between the etching amount B of the buried oxide film 15 and the HF treatment time is computed in advance based on experiments or the like and is stored in a server or the like. Thus, the treatment time in the HF treatment bath is appropriately selected in response to entry of the etching amount B determined in step S4. The relational expression between the etching amount B of the buried oxide film 15 and the recipe may be registered one for every 5 nm etching depth or less.

The recipe is not limited to the HF treatment time and may include temperature, for example. In the examples shown in FIGS. 4A and 4B, once the HF solution is replaced, correction based on the relational expression is done without performing concentration adjustment until the next replacement. However, the concentration may be included in the recipe so as to be adjusted. Moreover, as described below in detail, not only the recipe for the HF treatment bath, but also the recipe for a phosphoric acid treatment for removal of the SiN film 13r may be registered based on the measurement A of the thickness of the SiN film 13r.

After step S6 of FIG. 2, the concentration in the HF treatment bath is measured, and the lot count is calculated (these steps correspond to step S7 of FIG. 2). These results are fed back to the server. Based on the feedback, the HF treatment recipe for the buried oxide film 15 in the next lot is determined.

FIGS. 6A through 6F are diagrams illustrating steps for forming a transistor after determining the recipe. These steps correspond to step S6 of FIG. 2.

Figure 6A:
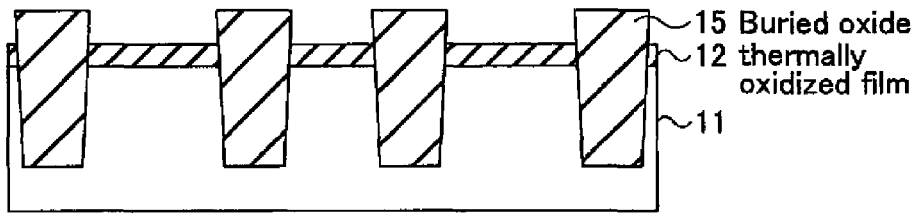
FIGS. 6A through 6F are diagrams illustrating a process of forming a transistor in an ACTIVE region.

First, with reference to FIG. 6A, using the HF treatment bath with the appropriately determined recipe, the buried oxide film 15 is etched by the specified etched amount B. Then, the SiN film 13r is removed by using phosphoric acid. As a result, a portion of the buried oxide film 15 appears slightly projecting on the wafer surface. The height (amount) of the projecting portion corresponds to the etching depth (amount) of the buried oxide film 15 in the following wet treatment to be performed before the process of forming the gate electrode. Accordingly, when determining the etching amount B in the preceding step, this projection amount is deduced.

Figure 6B:
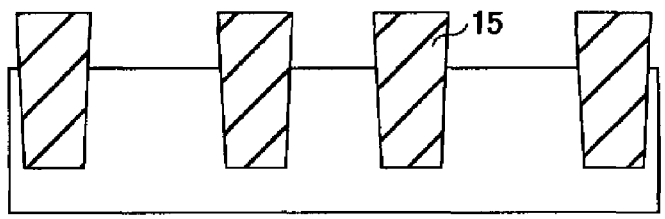

Then, as shown in FIG. 6B, the thermally oxidized film 12 is removed by HF treatment. In this process, the HF treatment bath used for etching the buried oxide film 15 may be used.

Figure 6C:
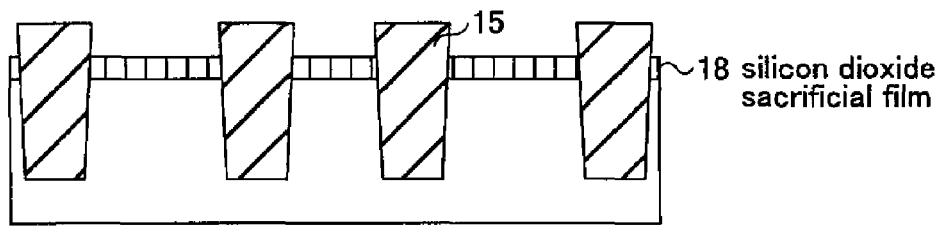
Figure 6D:
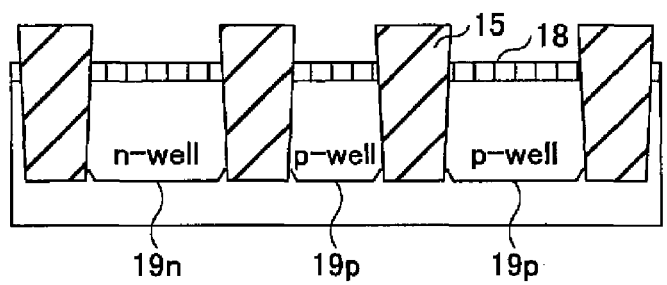

As shown in FIG. 6C, a sacrificial oxide film 18 for well implantation is formed. Then, as shown in FIG. 6D, in order to form PMOS and NMOMS regions, p-type wells 19p and an n-type well 19n are formed by repeatedly performing formation of resist with a specific pattern (not shown), ion implantation, and removal of the resist.

Figure 6E:
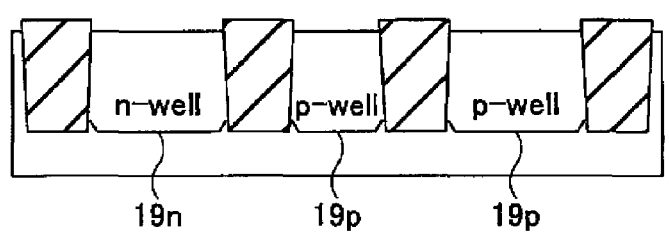

Then, as shown in FIG. 6E, the sacrificial oxide film 18 is removed by HF treatment. In this step, the surface of a STI region formed of the buried oxide film 15 substantially matches the substrate surface of an ACTIVE region.

Figure 6F:
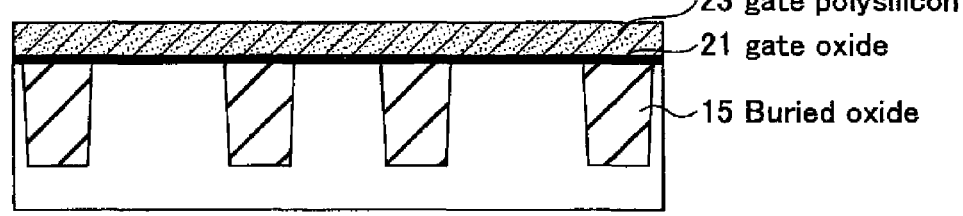

In the final step, as shown in FIG. 6F, a gate insulating film 21 is formed on the entire surface, and then a polysilicon film 23 as the gate electrode material is formed. After that, although not shown, a resist mask with a pattern corresponding to a gate electrode pattern is formed. The polysilicon film 23 is dry etched by using this resist mask, so that a gate electrode is formed. Using the gate electrode as a mask, n-type and p-type extension impurity diffusion regions are formed. A side wall spacer is formed on the side wall of the gate electrode. Using the side wall spacer as a mask, ions are implanted and thermally diffused, thereby forming n-type and p-type source/drain impurity diffusion regions. Then, the wafer surface is subjected to wet cleaning using an HF solution. Metal silicide is formed on the surfaces of the source and drain regions and the surface of the gate electrode, so that NMOS and PMOS transistors are formed.

When the transistor forming process is completed in this lot, the concentration in the HF treatment bath is measured, and the lot count is calculated (corresponding to step S7 of FIG. 2). These values are fed back to the server, and then the operation proceeds to the next lot (corresponding to step S8). Based on this feedback, the HF treatment recipe for the buried oxide film 15 in the next lot may be determined.

In this way, the method of this embodiment can reduce variations of electric properties by eliminating the silicon substrate—STI region level difference between lots.

FIG. 7 is a diagram schematically showing the configuration of a semiconductor device fabrication system 50 according to an embodiment of the present invention. The semiconductor device fabrication system 50 comprises a nitride film measurement apparatus 60, a rinse treatment apparatus 80, and a server 70 interconnecting the nitride film measurement apparatus 60 and the rinse treatment apparatus 80. The connection between the nitride film measurement apparatus 60 and the server 70 and the connection between the server 70 and the rinse treatment apparatus 80 may be wired or wireless.

The nitride film measurement apparatus 60 comprises a central processing unit (CPU) 61, a thickness measurements storing unit 62, a thickness measuring unit 63, and a thickness measurements transmission unit 64. The thickness measuring unit 63 non-destructively measures the thickness of the SiN film 13r after CMP with use of a well-know optical technique. Since the thickness of the SiN film 13r near the STI region is measured during the actual device fabrication process, there is no need to form a STI region especially for thickness measurement on the wafer. The measured thickness (a measurement A) of the SiN film 13r is held in the thickness measurements storing unit 62 and is also sent to the server 70 from the thickness measurements transmission unit 64.

The server 70 comprises a central processing unit (CPU) 71, a thickness measurements storing unit 72, a thickness measurements receiving unit 73, a recipe items storing unit 74, parameter storing units 75 through 77, and a recipe transmission unit 78. The thickness measurements receiving unit 73 receives the measured thickness (measurement A) of the SiN film 13r sent from the SiN measurement apparatus 60, and sends the measurement A to the CPU 71. The CPU 71 stores the measurement A into the thickness measurements storing unit 72, and determines the etching amount B of the buried oxide film 15 referring to the parameter storing units 75 and 76. The parameter storing unit 75 stores, for example, the liner function of FIG. 4A representing the relationship between the thickness (measurement A) of the SiN film 13r and the etching amount B of the buried oxide film 15. The parameter storing unit 76 stores, for example, the liner function of FIG. 4B representing the relationship between the HF life count and the etching rate of the buried oxide film 15 and the relationship between the HF lifetime and the etching rate of the buried oxide film 15.

The CPU 71 determines the recipe for the rinse treatment apparatus 80 based on the calculated etching amount B of the buried oxide film 15 with reference to the parameter storing unit 77. The parameter storing unit 77 stores, e.g., the liner function of FIG. 5 representing the relationship between the etching amount B and the HF treatment time. The CPU 71 determines the HF treatment time of the rinse treatment apparatus 80 as a recipe. The recipe items storing unit 74 may store not only the HF treatment time but also the phosphoric acid treatment time, solution temperature, concentration, etc. In that case, there may be provided parameter storing units for storing a relational expression between the thickness of the SiN film 13r and the etching amount of the SiN film 13r, a relational expression between the etching amount of the SiN film 13r and the phosphoric acid treatment time, and a relational expression between the etching amount and the solution temperature, etc. The recipe transmission unit 78 sends the recipe determined by the CPU 71 to the rinse treatment apparatus 80.

The rinse treatment apparatus 80 comprises a concentration meter 81, an HF bath 82, a phosphoric acid bath 84, rinse bathes 83 and 85, a dry bath 86, and a rinse treatment PC 90. The rinse treatment PC 90 comprises a full range CPU 91, an HF life count management 92, a recipe receiving unit 93, an HF concentration management 94, an HF lifetime management 95, and a recipe contents storing unit 96. The recipe receiving unit 93 receives the recipe sent from the server 70, and stores the contents of the recipe into the recipe contents storing unit 96 through the CPU 91. The CPU 91 determines, e.g., the HF treatment time in the HF bath 82 according to the received recipe.

The HF life count management 92 counts the number of times of the lots performed in one HF solution replacement cycle, and feeds back the count to the server 70 through the CPU 91. The HF lifetime management 96 manages the duration of HF solution circulation in the RF bath 82, and feeds back the time to the server 70 through the CPU 91. These feedbacks are used by the server 70 for correcting the treatment recipe for the buried oxide film 15. The HF concentration management 94 manages the concentration in the HF bath 82.

If the recipe includes the treatment time for the SiN film 13, the elapsed time since the last replacement of the phosphoric acid solution and the life count of the phosphoric acid solution may be managed and fed back to the server 70. Also, the concentrations of the HF solution and the phosphoric acid solution may be fed back to the server 70 so as to be reflected in the recipe.

In the example illustrated in FIG. 7, the server 70 is shown as an independent apparatus. However, the server 70 may be integrated with the nitride film measurement apparatus 60 or the rinse treatment apparatus 80. In both cases, the server 70 serves as a controlling unit for determining the etching amount B of the buried oxide film 15 and the recipe.

In this semiconductor device fabrication system 50, since the thickness of the SiN film 13r (stopper film) measured during the actual process is fed forward so as to determine the treatment recipe for the buried oxide film 15, the surfaces of the STI region after polishing the buried oxide film 15 and the ACTIVE region are substantially flush with each other. That is, the gate electrode can be formed on the flat wafer surface. This invention is employed not only for eliminating the level difference between the STI region and the ACTIVE region, but may be employed for obtaining the desired level difference between the STI region and the ACTIVE region.

The above described method is applicable to a semiconductor device fabrication process in which a process of filling a trench with oxide to form a buried oxide film is performed two times. FIGS. 8A through 8D illustrates such a fabrication process. The steps illustrated in FIGS. 8A through 8D correspond to step S2 of FIG. 2, i.e., a trench filling and CMP step.

Figure 8A:
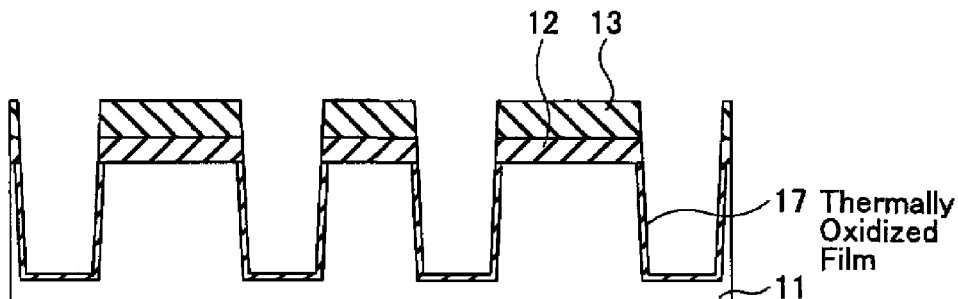
FIGS. 8A through 8D are diagrams illustrating a modified example of an STI region forming process.

With reference to FIG. 8A, as in the steps illustrated in FIGS. 3A through 3C, a thermally oxidized film 12 of 10 nm thickness is formed over a silicon substrate 11. Then, a SiN film 13 of 100 nm thickness is formed over the thermally oxidized film 12 by CVD or the like. Resist (not shown) is applied onto the SiN film 13 and is processed to have a specific pattern. With use of the resist pattern, the SiN film 13 and the thermally oxidized film 12 in the STI region are removed by dry etching. Then, specific areas of the Si substrate 11 are removed by selective dry etching, so that a trench having a depth in a range of 200 nm through 400 nm is formed in the Si substrate 11. The surface of the trench may be thermally oxidized by about 5 nm.

Figure 8B:
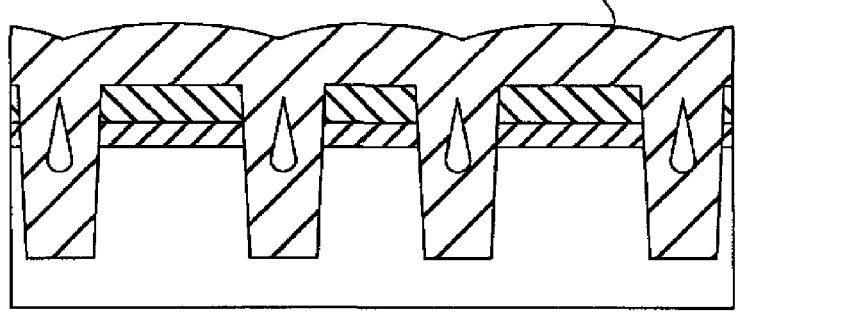
Figure 8C:
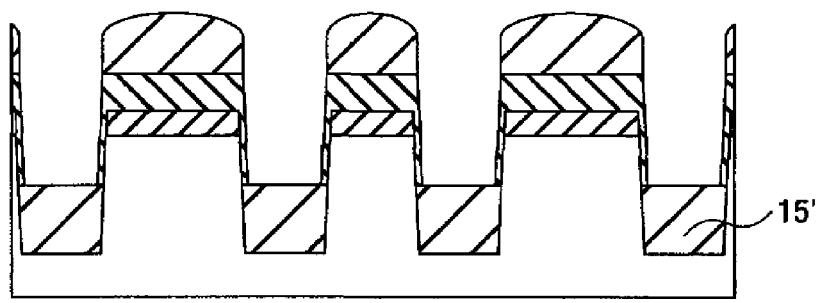
Figure 8D:
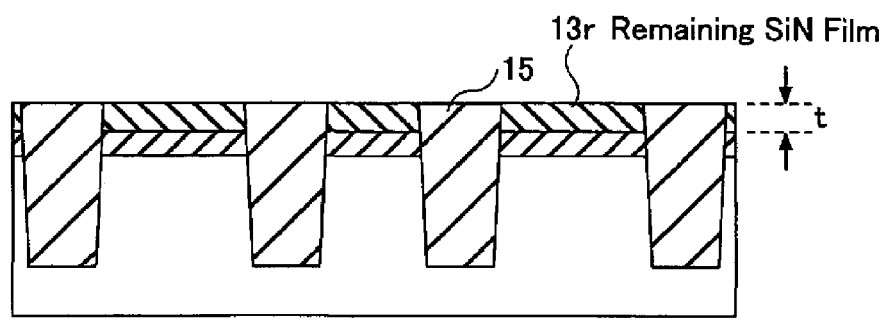

Then, as shown in FIG. 8B, an oxide film 15' is formed to fill the trench up to about a half of the height of the trench. In this step, the top of the trench is clogged with the oxide film 15'. If the oxide film 15' is left as is, dust is generated from the oxide film 15' clogging the top of the trench in the following steps. Therefore, as shown in FIG. 5C, the oxide film 15' clogging the top of the trench is removed by wet etching. Then, as shown in FIG. 8D, a process of filling the trench with oxide is performed again, so that a buried oxide film 15 is formed. After that, the buried oxide film 15 is polished by CMP until the SiN film 13 as a stopper film is exposed. The steps that follow are the same as those illustrated in FIG. 2.

This method can also prevent the level difference between the STI region and the ACTIVE region being produced, and reduce variation of electrode width in the step of forming the gate electrode. Thus, negative influence on electric properties such as Vth is reduced, while enhancing and stabilizing production yield.

What is claimed is:

1. A semiconductor device fabrication method comprising:
    forming an insulating film over a semiconductor substrate;
    forming a trench for device isolation in the semiconductor substrate;
    forming a first oxide film filling the trench;
    polishing the first oxide film over the semiconductor substrate until the insulating film is exposed;
    measuring a thickness of the insulating film remaining after the polishing;
    determining an etching amount of etching the polished first oxide film based on the measured thickness of the remaining insulating film;
    etching the polished first oxide film by using a treatment solution based on the determined etching amount;
    removing the insulating film;
    forming a second oxide film on the semiconductor substrate;
    implanting impurities into the semiconductor substrate through the second oxide film;
    removing the second oxide film;
    forming a gate insulating film on the semiconductor substrate;
    forming a film on the gate insulating film; and
    patterning the film on the gate insulating film,
    wherein in forming the second oxide film, a height of the first oxide film is higher than a height of the semiconductor substrate, and
    wherein in forming the film on the gate insulating film, the height of the first oxide film is substantially equal to the height of the semiconductor substrate.

2. The semiconductor device fabrication method as claimed in claim 1, further comprising:
    determining a treatment recipe for etching the polished first oxide film based on the amount of etching the polished first oxide film;
    wherein the etching is performed based on the determined treatment recipe.

3. The semiconductor device fabrication method as claimed in claim 1, further comprising:
    computing in advance a relationship between the thickness of the remaining insulating film and the etching amount of the polished first oxide film.

4. The semiconductor device fabrication method as claimed in claim 1, further comprising:
    computing a relationship between the etching amount of the polished first oxide film and a treatment recipe for etching the polished first oxide film.

5. The semiconductor device fabrication method as claimed in claim 1, further comprising:
    computing in advance a relationship between a time elapsed and a number of fabrication lots processed after replacement of the treatment solution and an etching rate of the first oxide film.

6. The semiconductor device fabrication method as claimed in claim 1, wherein the insulating film includes a silicon nitride film, and the first oxide film includes a silicon oxide film.

7. The semiconductor device fabrication method as claimed in claim 1, wherein the treatment solution includes hydrofluoric acid.

8. The semiconductor device fabrication method as claimed in claim 1, wherein the measuring and the determining are performed by a film thickness measuring unit and a treating amount determining unit, respectively, of a semiconductor device fabrication system.

9. The semiconductor device fabrication method as claimed in claim 1, further comprising:
    correcting a treatment recipe for etching the polished first oxide film by using the treatment solution based on a time elapsed and a number of lots processed after replacement of the treatment solution used for the etching of the polished first oxide film.

10. The semiconductor device fabrication method as claimed in claim 1, wherein the gate insulating film is an oxide film, and the film on the gate insulating film is an Si film.

11. The semiconductor device fabrication method as claimed in claim 1, wherein the measuring a thickness of the insulating film includes:
    measuring the thickness of the insulating film remaining after the polishing without measuring a thickness of the first oxide film under a condition in which there is variation in a polished amount of the first oxide film that is polished by the polishing.

* * * * *